(12) United States Patent
Zhao (10) Patent No.: US 11,545,104 B2
(45) Date of Patent: Jan. 3, 2023

(54) GOA DEVICE FOR REDUCING LEAKAGE, AND DISPLAY PANEL THEREOF

(71) Applicant: Wuhan China Star Optoelectronics Technology Co., Ltd., Hubei (CN)

(72) Inventor: Mang Zhao, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 52 days.

(21) Appl. No.: 16/966,034

(22) PCT Filed: Apr. 3, 2020

(86) PCT No.: PCT/CN2020/083126
§ 371 (c)(1),
(2) Date: Jul. 30, 2020

(87) PCT Pub. No.: WO2021/120449
PCT Pub. Date: Jun. 24, 2021

(65) Prior Publication Data
US 2021/0264868 A1    Aug. 26, 2021

(30) Foreign Application Priority Data
Dec. 19, 2019   (CN) .......................... 201911317334.0

(51) Int. Cl.
*G09G 3/36* (2006.01)
*G11C 19/28* (2006.01)
*G09G 3/20* (2006.01)

(52) U.S. Cl.
CPC ............. *G09G 3/3677* (2013.01); *G09G 3/20* (2013.01); *G09G 2300/0426* (2013.01); *G09G 2310/0267* (2013.01); *G09G 2310/0286* (2013.01); *G11C 19/28* (2013.01)

(58) Field of Classification Search
CPC .................. G09G 3/3677; G09G 3/20; G09G 2300/0426; G09G 2310/0267; G09G 2310/0286; G11C 19/28
See application file for complete search history.

(56) References Cited

U.S. PATENT DOCUMENTS

| | | | | |
|---|---|---|---|---|
| 9,875,706 | B1* | 1/2018 | Gong ................... | G09G 3/3677 |
| 2008/0116944 | A1 | 5/2008 | Tobita et al. | |
| 2018/0190179 | A1* | 7/2018 | Zhao ..................... | G09G 3/2092 |
| 2018/0190181 | A1* | 7/2018 | Zhao ..................... | G09G 3/2096 |
| 2019/0259338 | A1* | 8/2019 | Li .......................... | G09G 3/3677 |
| 2021/0225311 | A1* | 7/2021 | Zhang .................. | G09G 3/3677 |

FOREIGN PATENT DOCUMENTS

| CN | 102117659 | 7/2011 |
|---|---|---|
| CN | 104282255 | 1/2015 |
| CN | 106023919 | 10/2016 |
| CN | 108010495 | 5/2018 |

(Continued)

*Primary Examiner* — Adam J Snyder (57) ABSTRACT

A gate driver on array (GOA) device and a display panel are proposed. In the present application, by adding a twenty-first transistor and a first control clock terminal electrically connected to the twenty-first transistor in a forward-reverse scan module to control potentials of a first node and a third node, a leakage of the first node during operation can be reduced, thereby improving reliability of the GOA device.

10 Claims, 4 Drawing Sheets

(56) References Cited

FOREIGN PATENT DOCUMENTS

| | | | | |
|---|---|---|---|---|
| CN | 108630167 A | * | 10/2018 | ........... G09G 3/3677 |
| CN | 109300428 | | 2/2019 | |
| CN | 109326261 | | 2/2019 | |
| CN | 109559697 A | * | 4/2019 | ........... G09G 3/3677 |
| WO | WO-2018107534 A1 | * | 6/2018 | ........... G09G 3/3677 |

* cited by examiner

GOA DEVICE FOR REDUCING LEAKAGE, AND DISPLAY PANEL THEREOF

RELATED APPLICATIONS

This application is a National Phase of PCT Patent Application No. PCT/CN2020/083126 having International filing date of Apr. 3, 2020, which claims the benefit of priority of Chinese Patent Application No. 201911317334.0 filed on Dec. 19, 2019. The contents of the above applications are all incorporated by reference as if fully set forth herein in their entirety.

FIELD AND BACKGROUND OF THE INVENTION

The present application relates to the field of display technologies, and in particular to a gate driver on array (GOA) device and a display panel.

Gate driver on array (GOA, gate driving integrated circuit) technology integrates a gate driving circuit on an array substrate of a display panel, therefore a gate driving integrated circuit can be omitted, and product cost can be reduced in both material cost and manufacturing process.

Conventional GOA devices have a risk of leakage and poor reliability.

Therefore, there is an urgent need for the display panel to solve the above technical problems.

SUMMARY OF THE INVENTION

Technical Problem

The purpose of embodiments of the present application is to provide a gate driver on array (GOA) device and a display panel, which can solve the technical problems of conventional GOA devices such as leakage and poor reliability.

Technical Solution

The present application proposes a GOA device, which includes multiple cascaded GOA units, any stage of GOA unit including a forward-reverse scan module, an output module, a pull-down module, and a function control module;

wherein the forward-reverse scan module receives a scan driving signal of a previous stage, a forward scan signal, a scan driving signal of a next stage, a reverse scan signal, and a constant-voltage low-level signal, and is electrically connected to a first control clock terminal, a first node, and a second node, configured to output the forward scan signal to the first node, or configured to output the reverse scan signal to the first node, and outputs the constant-voltage low-level signal to the second node under a control of a potential of the first node;

wherein the output module receives the constant-voltage low-level signal and a constant-voltage high-level signal, and is electrically connected to the first node and a third control clock terminal, configured to output a scan driving signal of a current stage;

wherein the pull-down module receives the constant-voltage low-level signal, the forward scan signal, the reverse scan signal, and the constant-voltage high-level signal, and is electrically connected to the second control clock terminal, a fourth control clock terminal, the first node, and the scan driving signal of the current stage, configured to pull down the potential of the first node and a potential of the scan driving signal of the current stage to a potential of the constant-voltage low-level signal;

wherein the function control module receives a first function control signal and a second function control signal, and is electrically connected to the first node, the second node, and the scan driving signal of the current stage, configured to realize a turn on function and a turn off function of the GOA device on all scan driving signals; and wherein the forward scan signal and the reverse scan signal are both direct current (DC) power sources, and a potential of the forward scan signal is opposite to a potential of the reverse scan signal.

In the GOA device of the present application, the forward-reverse scan module includes a second transistor, a twenty-first transistor, a twenty-second transistor, a twenty-third transistor, a fourth transistor, and a fifth transistor;

wherein a gate of the second transistor receives the scan driving signal of the previous stage, a source of the second transistor receives the forward scan signal, and a drain of the second transistor is electrically connected to the third node;

wherein a gate of the twenty-first transistor and a gate of the twenty-second transistor are electrically connected to the third node, a drain of the twenty-first transistor and a drain of the twenty-second transistor are electrically connected to the first node, the gate of the twenty-first transistor is electrically connected to the first control clock terminal, and the gate of the twenty-second transistor is electrically connected to a gate of a tenth transistor;

wherein a gate of the fourth transistor receives the scan driving signal of the next stage, a source of the fourth transistor receives the reverse scan signal, and a drain of the fourth transistor is electrically connected to the third node and the gate of the twenty-third transistor;

wherein a source of the twenty-third transistor receives the constant-voltage low-level signal, and a drain of the twenty-third transistor is electrically connected to the second node and the drain of the tenth transistor; and wherein a gate of the fifth transistor is electrically connected to the first node, a source of the fifth transistor receives the constant-voltage low-level signal, and a drain of the fifth transistor is electrically connected to the second node and the drain of the tenth transistor.

In the GOA device of the present application, the output module includes a sixth transistor, a seventh transistor, and a first capacitor;

wherein a gate of the sixth transistor receives the constant-voltage high-level signal, a source of the sixth transistor is electrically connected to the first node, and a drain of the sixth transistor is electrically connected to a gate of the seventh transistor;

wherein a source of the seventh transistor is electrically connected to the third control clock terminal, and a drain of the seventh transistor is electrically connected to the scan driving signal of the current stage; and wherein an end of the first capacitor is electrically connected to the first node, and another end of the first capacitor is electrically connected to the constant-voltage low-level signal.

In the GOA device of the present application, the pull-down module includes an eighth transistor, a ninth transistor, a tenth transistor, an eleventh transistor, a twelfth transistor, and a second capacitor; wherein a gate of the eighth transistor receives the forward scan signal, a source of the eighth transistor is electrically connected to the third control clock terminal, a gate of the ninth transistor receives the reverse scan signal, a source of the ninth transistor is electrically connected to the first control clock terminal, a drain of the eighth transistor and a drain of the ninth transistor are electrically connected to a gate of the tenth transistor, a source of the tenth transistor receives the constant-voltage high-level signal, a drain of the tenth transistor, a gate of the eleventh transistor, and a gate of the twelfth transistor are electrically connected to the second node, a source of the eleventh transistor and a source of the twelfth transistor receive the constant-voltage low-level signal, a drain of the eleventh transistor is electrically connected to the first node, a drain of the twelfth transistor is electrically connected to the scan driving signal of the current stage, an end of the second capacitor is electrically connected to the second node, and another end of the second capacitor is electrically connected to the constant-voltage low-level signal.

In the GOA device of the present application, the GOA circuit receives first clock signal, second clock signal, third clock signal, and fourth clock signal, and the first clock signal, the second clock signal, the third clock signal, and the fourth clock signal are respectively valid within one operating period in turn.

In the GOA device of the present application, in a (1+4 k)th staged GOA unit, the first control clock terminal receives the third clock signal, the second control clock terminal receives the fourth clock signal, the third control clock terminal receives the first clock signal, and the fourth control clock terminal receives the second clock signal;

in a (2+4 k)th staged GOA unit, the first control clock terminal receives the fourth clock signal, the second control clock terminal receives the first clock signal, the third control clock terminal is connected the second clock signal, and the fourth control clock terminal receives the third clock signal;

in a (3+4 k)th staged GOA unit, the first control clock terminal receives the first clock signal, the second control clock terminal receives the second clock signal, the third control clock terminal receives the third clock signal, and the fourth control clock terminal receives the fourth clock signal; and in a (4+4 k)th staged GOA unit, the first control clock terminal receives the second clock signal, the second control clock terminal receives the third clock signal, the third control clock terminal receives the fourth clock signal, and the fourth control clock terminal receives the first clock signal; where k is a positive integer.

In the GOA device of the present application, the function control module includes a thirteenth transistor, a fourteenth transistor, a fifteenth transistor, and a sixteenth transistor; wherein a gate of the thirteenth transistor, a gate of the fourteenth transistor, and a source and a gate of the fifteenth transistor receive the first function control signal, a gate of the sixteenth transistor receives the second function control signal, a source of the thirteenth transistor, a source of the fourteenth transistor, and a source of the sixteenth transistor receive the constant-voltage low-level signal, a drain of the thirteenth transistor is electrically connected to the first node, a drain of the fourteenth transistor is electrically connected to the second node, and a drain of the fifteenth transistor and a drain of the sixteenth transistor are electrically connected to the scan driving signal of the current stage.

In the GOA device of the present application, the function control module includes a thirteenth transistor, a fourteenth transistor, a fifteenth transistor, and a sixteenth transistor; wherein a gate of the thirteenth transistor, a gate of the fourteenth transistor, and a source and a gate of the fifteenth transistor receive the first function control signal, a source of the thirteenth transistor and a gate of the sixteenth transistor receive the second function control signal, a source of the fourteenth transistor and a source of the sixteenth transistor receive the constant-voltage low-level signal, a drain of the thirteenth transistor is electrically connected to the first node, a drain of the fourteenth transistor is electrically connected to the second node, a drain of the fifteenth transistor and a drain of the sixteenth transistor are electrically connected to the scan driving signal of the current stage.

In the GOA device of the present application, the GOA device further including a turn on function phase and a turn off function phase, wherein in the turn on function phase, the first function control signal is high-level and the second function control signal is low-level; in the turn off function phase, the first function control signal is low-level and the second function control signal is high-level.

The present application further provided a display panel, which includes a gate driver on array (GOA) device and a functional display layer disposed on the GOA device, wherein the GOA device includes multiple cascaded GOA units, any stage of GOA unit includes a forward-reverse scan module, an output module, a pull-down module, and a function control module;

wherein the forward-reverse scan module receives a scan driving signal of a previous stage, a forward scan signal, a scan driving signal of a next stage, a reverse scan signal, and a constant-voltage low-level signal, and is electrically connected to a first control clock terminal, a first node, and a second node, configured to output the forward scan signal to the first node, or configured to output the reverse scan signal to the first node, and outputting the constant-voltage low-level signal to the second node under a control of a potential of the first node;

wherein the output module receives the constant-voltage low-level signal and a constant-voltage high-level signal, and is electrically connected to the first node and a third control clock terminal, configured to output a scan driving signal of a current stage;

wherein the pull-down module receives the constant-voltage low-level signal, the forward scan signal, the reverse scan signal, and the constant-voltage high-level signal, and is electrically connected to the second control clock terminal, a fourth control clock terminal, the first node, and the scan driving signal of the current stage, configured to pull down the potential of the first node and a potential of the scan driving signal of the current stage to a potential of the constant-voltage low-level signal;

wherein the function control module receives a first function control signal and a second function control signal, and is electrically connected to the first node, the second node, and the scan driving signal of the current stage, configured to realize a turn on function and a turn off function of the GOA device on all scan driving signals; and wherein the forward scan signal and the reverse scan signal are both direct current (DC) power sources, and a potential of the forward scan signal is opposite to a potential of the reverse scan signal.

In the display panel of the present application, the forward-reverse scan module includes a second transistor, a twenty-first transistor, a twenty-second transistor, a twenty-third transistor, a fourth transistor, and a fifth transistor;

wherein a gate of the second transistor receives the scan driving signal of the previous stage, a source of the second transistor receives the forward scan signal, and a drain of the second transistor is electrically connected to the third node;

wherein a gate of the twenty-first transistor and a gate of the twenty-second transistor are electrically connected to the third node, a drain of the twenty-first transistor and a drain of the twenty-second transistor are electrically connected to the first node, the gate of the twenty-first transistor is electrically connected to the first control clock terminal, and the gate of the twenty-second transistor is electrically connected to a gate of a tenth transistor;

wherein a gate of the fourth transistor receives the scan driving signal of the next stage, a source of the fourth transistor receives the reverse scan signal, and a drain of the fourth transistor is electrically connected to the third node and the gate of the twenty-third transistor;

wherein a source of the twenty-third transistor receives the constant-voltage low-level signal, and a drain of the twenty-third transistor is electrically connected to the second node and the drain of the tenth transistor; and wherein a gate of the fifth transistor is electrically connected to the first node, a source of the fifth transistor is connected to the constant-voltage low-level signal, and a drain of the fifth transistor is electrically connected to the second node and the drain of the tenth transistor.

In the display panel of the present application, the output module includes a sixth transistor, a seventh transistor, and a first capacitor;

wherein a gate of the sixth transistor receives the constant-voltage high-level signal, a source of the sixth transistor is electrically connected to the first node, and a drain of the sixth transistor is electrically connected to a gate of the seventh transistor;

wherein a source of the seventh transistor is electrically connected to the third control clock terminal, and a drain of the seventh transistor is electrically connected to the scan driving signal of the current stage; and wherein an end of the first capacitor is electrically connected to the first node, and another end of the first capacitor is electrically connected to the constant-voltage low-level signal.

In the display panel of the present application, the pull-down module includes an eighth transistor, a ninth transistor, a tenth transistor, an eleventh transistor, a twelfth transistor, and a second capacitor; wherein a gate of the eighth transistor receives the forward scan signal, a source of the eighth transistor is electrically connected to the third control clock terminal, a gate of the ninth transistor receives the reverse scan signal, a source of the ninth transistor is electrically connected to the first control clock terminal, a drain of the eighth transistor and a drain of the ninth transistor are electrically connected to a gate of the tenth transistor, a source of the tenth transistor receives the constant-voltage high-level signal, a drain of the tenth transistor, a gate of the eleventh transistor, and a gate of the twelfth transistor are electrically connected to the second node, a source of the eleventh transistor and a source of the twelfth transistor receive the constant-voltage low-level signal, a drain of the eleventh transistor is electrically connected to the first node, a drain of the twelfth transistor is electrically connected to the scan driving signal of the current stage, an end of the second capacitor is electrically connected to the second node, and another end of the second capacitor is electrically connected to the constant-voltage low-level signal.

In the display panel of the present application, the GOA circuit receives first clock signal, second clock signal, third clock signal, and fourth clock signal, and the first clock signal, the second clock signal, the third clock signal, and the fourth clock signal are respectively valid within one operating period in turn.

In the display panel of the present application, in a (1+4 k)th staged GOA unit, the first control clock terminal receives the third clock signal, the second control clock terminal receives the fourth clock signal, the third control clock terminal receives the first clock signal, and the fourth control clock terminal receives the second clock signal;

in a (2+4 k)th staged GOA unit, the first control clock terminal receives the fourth clock signal, the second control clock terminal receives the first clock signal, the third control clock terminal is connected the second clock signal, and the fourth control clock terminal receives the third clock signal;

in a (3+4 k)th staged GOA unit, the first control clock terminal receives the first clock signal, the second control clock terminal receives the second clock signal, the third control clock terminal receives the third clock signal, and the fourth control clock terminal receives the fourth clock signal; and in a (4+4 k)th staged GOA unit, the first control clock terminal receives the second clock signal, the second control clock terminal receives the third clock signal, the third control clock terminal receives the fourth clock signal, and the fourth control clock terminal receives the first clock signal; where k is a positive integer.

In the display panel of the present application, the function control module includes a thirteenth transistor, a fourteenth transistor, a fifteenth transistor, and a sixteenth transistor; wherein a gate of the thirteenth transistor, a gate of the fourteenth transistor, and a source and a gate of the fifteenth transistor receive the first function control signal, a source of the thirteenth transistor and a gate of the sixteenth transistor receive the second function control signal, a source of the fourteenth transistor and a source of the sixteenth transistor receive the constant-voltage low-level signal, a drain of the thirteenth transistor is electrically connected to the first node, a drain of the fourteenth transistor is electrically connected to the second node, a drain of the fifteenth transistor and a drain of the sixteenth transistor are electrically connected to the scan driving signal of the current stage.

In the display panel of the present application, the function control module includes a thirteenth transistor, a fourteenth transistor, a fifteenth transistor, and a sixteenth transistor; wherein a gate of the thirteenth transistor, a gate of the fourteenth transistor, and a source and a gate of the fifteenth transistor receive the first function control signal, a source of the thirteenth transistor and a gate of the sixteenth transistor receive the second function control signal, a source of the fourteenth transistor and a source of the sixteenth transistor receive the constant-voltage low-level signal, a drain of the thirteenth transistor is electrically connected to the first node, a drain of the fourteenth transistor is electrically connected to the second node, a drain of the fifteenth transistor and a drain of the sixteenth transistor are electrically connected to the scan driving signal of the current stage.

In the display panel of the present application, the GOA device further including a turn on function phase and a turn off function phase, wherein in the turn on function phase, the first function control signal is high-level and the second function control signal is low-level; in the turn off function phase, the first function control signal is low-level and the second function control signal is high-level.

Beneficial Effect

The present application proposes a GOA device and a display panel. In the present application, by adding the twenty-first transistor and the first control clock terminal electrically connected to the twenty-first transistor in the forward-reverse scan module to control the potentials of the first node and the third node, the leakage of the first node during operation can be reduced, thereby improving reliability of the GOA device.

DESCRIPTION OF SPECIFIC EMBODIMENTS OF THE INVENTION

In order to illustrate the purpose, technical solutions, and effects of the present application in a clearer manner, the present application will be described in further detail below with reference to the accompanying drawings and examples. It should be understood that the specific embodiments described herein are only configured to explain the present application, and are not configured to limit the present application.

Figure 1:
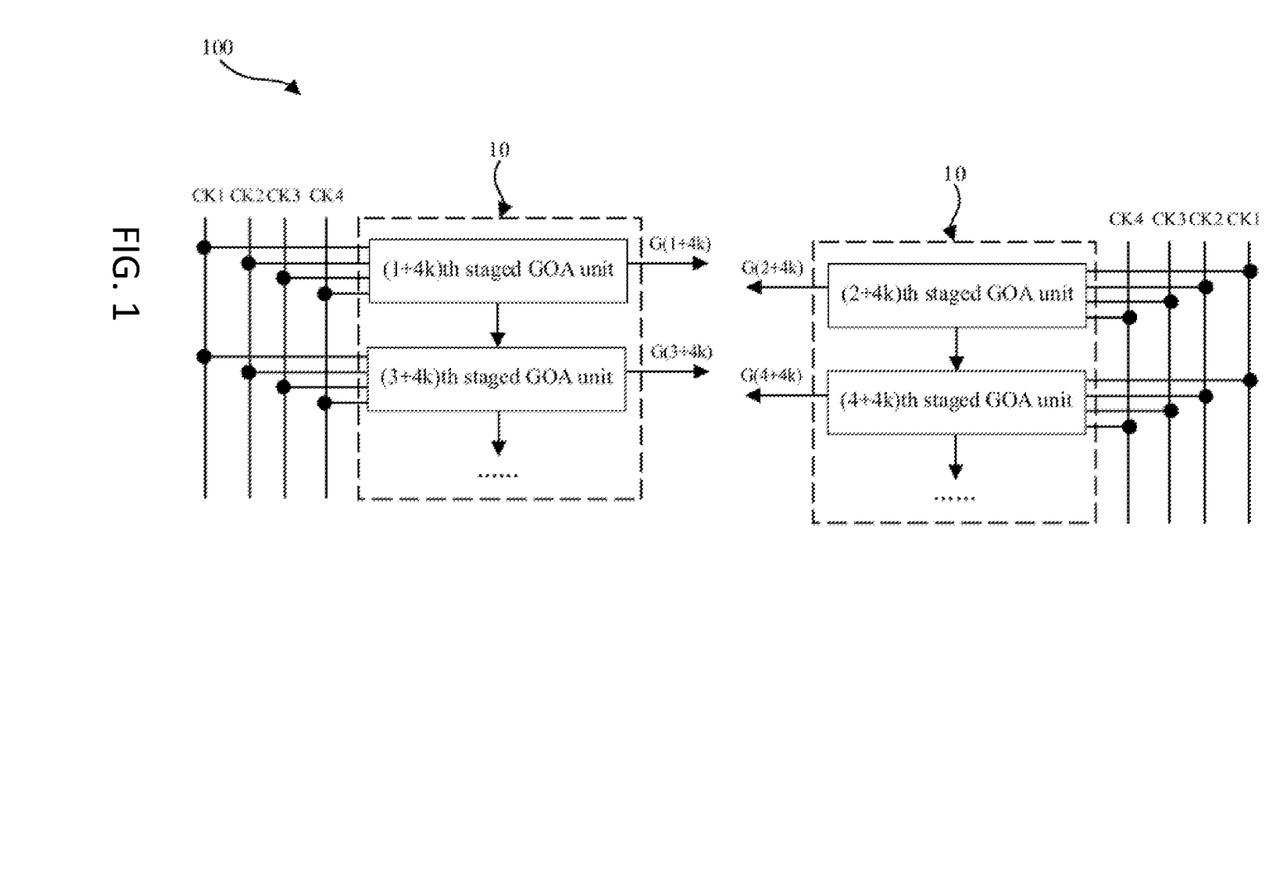
FIG. 1 is a structural schematic diagram of a gate driver on array (GOA) device of the present application.

Please refer to FIG. 1, in which a gate driver on array (GOA) device 100 provided by the present application includes multiple cascaded GOA units. An n-th staged GOA unit is configured to output an n-th staged scan driving signal to charge correspondingly an n-th scan line in a display region, so as to realize normal display of a display panel.

The GOA device 100 provided by the present application can include a GOA sub-circuit 10 formed by cascaded odd staged GOA units and a GOA sub-circuit 10 formed by cascaded even staged GOA units. The following embodiments are described by taking a cascaded structure shown in FIG. 1 as an example.

Refer to FIG. 1, in which the GOA device 100 of an embodiment of the present application receives a first clock signal CK1, a second clock signal CK2, a third clock signal CK3, and a fourth clock signal CK4. The first clock signal CK1, the second clock signal CK2, the third clock signal CK3, and the fourth clock signal CK4 are respectively valid within one operating period in turn of the GOA device 100.

In the present embodiment, in a (1+4 k)th staged GOA unit, a first control clock terminal CK(n−2) receives the third clock signal CK3, a second control clock terminal CK(n−1) receives the fourth clock signal CK4, a third control clock terminal CK(n) receives the first clock signal CK1, and a fourth control clock terminal CK(n+2) receives the second clock signal CK2, where k is a positive integer. For example, in a first staged GOA unit and a fifth staged GOA unit, the first control clock terminal CK(n−2) receives the third clock signal CK3, and the second control clock terminal CK(n−1) receives the fourth clock signal CK4, the third control clock terminal CK(n) receives the first clock signal CK1, and the fourth control clock terminal CK(n+2) receives the second clock signal CK2.

In the present embodiment, in a (2+4 k)th staged GOA unit, the first control clock terminal CK(n−2) receives the fourth clock signal CK4, the second control clock terminal CK(n−1) receives the first clock signal CK1, the third control clock terminal CK(n) receives the second clock signal CK2, the fourth control clock terminal CK(n+2) receives the third clock signal CK3, where k is a positive integer. For example, in a second staged GOA unit and a sixth staged GOA unit, the first control clock terminal CK(n−2) receives the fourth clock signal CK4, the second control clock terminal CK(n−1) is connected the first clock signal CK1, the third control clock terminal CK(n) receives the second clock signal CK2, and the fourth control clock terminal CK(n+2) receives the third clock signal CK3.

In the present embodiment, in a (3+4 k)th staged GOA unit, the first control clock terminal CK(n−2) receives the first clock signal CK1, the second control clock terminal CK(n−1) receives the second clock signal CK2, the third control clock terminal CK(n) receives the third clock signal CK3, and the fourth control clock terminal CK(n+2) receives the fourth clock signal CK4, where k is a positive integer. For example, in a third staged GOA unit and a seventh staged GOA unit, the first control clock terminal CK(n−2) receives the first clock signal CK1, the second control clock terminal CK(n−1) receives the second clock signal CK2, the third control clock terminal CK(n) receives the third clock signal CK3, and the fourth control clock terminal CK(n+2) receives the fourth clock signal CK4.

In the present embodiment, in a (4+4 k)th staged GOA unit, the first control clock terminal CK(n−2) receives the second clock signal CK2, the second control clock terminal CK(n−1) receives the third clock signal CK3, the third control clock terminal CK(n) receives the fourth clock signal CK4, and the fourth control clock terminal CK(n+2) receives the first clock signal CK1, where k is a positive integer. For example, in a fourth staged GOA unit and an eighth staged GOA unit, the first control clock terminal CK(n−2) receives the second clock signal CK2, the second control clock terminal CK(n−1) receives the third clock signal CK3, the third control clock terminal CK(n) receives the fourth clock signal CK4, and the fourth control clock terminal CK(n+2) receives the first clock signal CK1.

Figure 2:
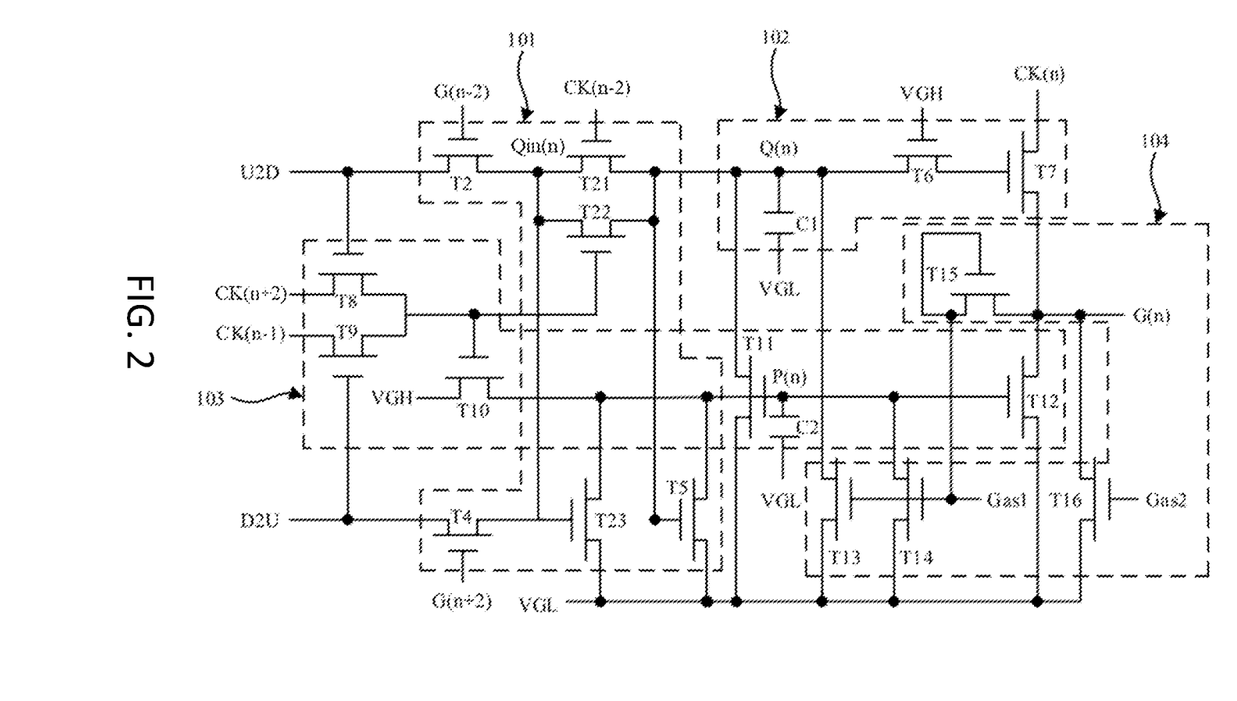
FIG. 2 is a schematic diagram of a first circuit of a GOA unit of the GOA device of the present application.

Refer to FIG. 2, in which the GOA unit can include a forward-reverse scan module 101, an output module 102, a pull-down module 103, and a function control module 104.

In the present embodiment, the forward-reverse scan module 101 receives a scan driving signal of a previous stage G(n−2), a forward scan signal U2D, a scan driving signal of a next stage G(n+2), a reverse scan signal D2U, and a constant-voltage low-level signal VGL, and is electrically connected to a first control clock terminal CK(n−2), a first node Q(n), and a second node P(n), configured to output the forward scan signal U2D to the first node Q(n), or configured to output the reverse scan signal D2U to the first node Q(n), and outputting the constant-voltage low-level signal VGL to the second node P(n) under a control of a potential of the first node Q(n).

In the present embodiment, the output module 102 receives the constant-voltage low-level signal VGL and a constant-voltage high-level signal VGH, and is electrically connected to the first node Q(n) and the third control clock terminal CK(n), configured to output a scan driving signal G(n) of a current stage.

In the present embodiment, the pull-down module 103 receives the constant-voltage low-level signal VGL, the forward scan signal U2D, the reverse scan signal D2U, and the constant-voltage high-level signal VGH, and is electrically connected to the second control clock terminal CK(n−1), the fourth control clock terminal CK(n+2), the first node Q(n), and the scan driving signal of the current stage G(n), configured to pull down the potential of the first node Q(n)

and a potential of the scan driving signal G(n) of the current stage to a potential of the constant-voltage low-level signal VGL.

In the present embodiment, the function control module 104 receives a first function control signal Gas1 and a second function control signal Gas2, and is electrically connected to the first node Q(n), the second node P(n), and the scan driving signal G(n) of the current stage, configured to realize a turn on function and a turn off function of the GOA device 100 on all scan driving signals.

Refer to FIG. 2, in which the forward-reverse scan module 101 can include a second transistor T2, a twenty-first transistor T21, a twenty-second transistor T22, a twenty-third transistor T23, a fourth transistor T4, and a fifth transistor T5.

Wherein, a gate of the second transistor T2 receives the scan driving signal of the previous stage G(n−2), a source of the second transistor T2 receives the forward scan signal U2D, and a drain of second transistor T2 is electrically connected to a third node Qin(n). A source of the twenty-first transistor T21 and a source of the twenty-second transistor T22 are electrically connected to the third node Qin(n), a drain of the twenty-first transistor T21 and a drain of the twenty-second transistor T22 are electrically connected to the first node Q(n), the gate of the twenty-first transistor T21 is electrically connected to the first control clock terminal CK(n−2), and the gate of the twenty-second transistor T22 is electrically connected to a gate of a tenth transistor T10. A gate of the fourth transistor T4 receives the scan driving signal of the next stage G(n+2), a source of the fourth transistor T4 receives the reverse scan signal D2U, and a drain of the fourth transistor T4 is electrically connected to the third node Qin(n) and the gate of the twenty-third transistor T23. A source of the twenty-third transistor T23 receives the constant-voltage low-level signal VGL, and a drain of the twenty-third transistor T23 is electrically connected to the second node P(n) and the drain of the tenth transistor T10. A gate of the fifth transistor T5 is electrically connected to the first node Q(n), a source of the fifth transistor T5 receives the constant-voltage low-level signal VGL, and a drain of the fifth transistor T5 is electrically connected to the second node P(n) and the drain of the tenth the transistor T10.

Refer to FIG. 2, in which the output module 102 includes a sixth transistor T6, a seventh transistor T7, and a first capacitor C1.

Wherein, a gate of the sixth transistor T6 receives the constant-voltage high-level signal VGH, a source of the sixth transistor T6 is electrically connected to the first node Q(n), and a drain of the sixth the transistor T6 is electrically connected to a gate of the seventh transistor T7. A source of the seventh transistor T7 is electrically connected to the third control clock terminal CK(n), and a drain of the seventh transistor T7 is electrically connected to the scan driving signal of the current stage G(n). An end of the first capacitor C1 is electrically connected to the first node Q(n), and another end of the first capacitor C1 is electrically connected to the constant-voltage low-level signal VGL.

Refer to FIG. 2, in which the pull-down module 103 includes an eighth transistor T8, a ninth transistor T9, a tenth transistor T10, an eleventh transistor T11, a twelfth transistor T12, and a second capacitor C2.

A gate of the eighth transistor T8 receives the forward scan signal U2D, a source of the eighth transistor T8 is electrically connected to the fourth control clock terminal CK(n+2), a gate of the ninth transistor T9 receives the reverse scan signal D2U, a source of the ninth transistor T9 is electrically connected to the second control clock terminal CK(n−1), a drain of the eighth transistor T8 and a drain of the ninth transistor T9 are electrically connected to a gate of the tenth transistor T10, a source of the tenth transistor T10 receives the constant-voltage high-level signal VGH, a drain of the tenth transistor T10, a gate of the eleventh transistor T11, and a gate of the twelfth transistor T12 are electrically connected to the second node P(n), a source of the eleventh transistor T11 and a source of the twelfth transistor T12 receive the constant-voltage low-level signal VGL, a drain of the eleventh transistor T11 is electrically connected to the first node Q(n), a drain of the twelfth transistor T12 is electrically connected to the scan driving signal of the current stage G(n), an end of the second capacitor C2 is electrically connected to the second node P(n), and another end of the second capacitor C2 is electrically connected to the constant-voltage low-level signal VGL.

Refer to FIG. 2, in which the function control module 104 includes a thirteenth transistor T13, a fourteenth transistor T14, a fifteenth transistor T15, and a sixteenth transistor T16.

Wherein, a gate of the thirteenth transistor T13, a gate of the fourteenth transistor T14, and a source and a gate of the fifteenth transistor T15 receive the first function control signal Gas1, a gate of the sixteenth transistor T16 receives the second function control signal Gas2. A source of the thirteenth transistor T13, a source of the fourteenth transistor T14, and a source of the sixteenth transistor T16 receive the constant-voltage low-level signal VGL. A drain of the thirteenth transistor T13 is electrically connected to the first node Q(n). A drain of the fourteenth transistor T14 is electrically connected to the second node P(n). A drain of the fifteenth transistor T15 and a drain of the sixteenth transistor T16 are electrically connected to the scan driving signal of the current stage G(n).

The technical solution of the present application will be described below by taking the third staged GOA unit as an example.

Figure 3:
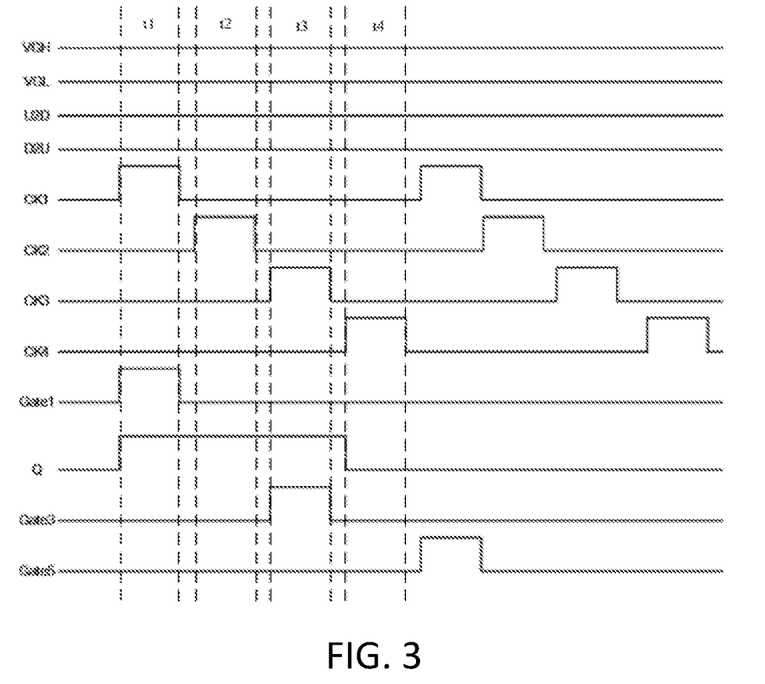
FIG. 3 is a sequence diagram of a third staged GOA unit in the GOA device of the present application.

Please refer to FIG. 3, which is a sequence diagram of the third staged GOA unit in the GOA device 100 of the present application. Wherein, the first clock signal CK1, the second clock signal CK2, the third clock signal CK3, and the fourth clock signal CK4 are clock signals with a same period and having a phase difference.

In the third staged GOA unit, the first control clock terminal CK(n−2) receives the first clock signal CK1, the second control clock terminal CK(n−1) receives the second clock signal CK2, the third control clock terminal CK(n) receives the third clock signal CK3, and the fourth control clock terminal CK(n+2) receives the fourth clock signal CK4.

Please refer to FIGS. 2-3, when the GOA device 100 performs forward scanning, the forward scan signal U2D is at a high-level and the reverse scan signal D2U is at a low-level. During a first time period t1, the first clock signal CK1 is at the high-level, and the scan driving signal of the previous stage G1 is at the high-level. At this time, the twenty-first transistor T21 and the second transistor T2 are turned on, the forward scan signal U2D is outputted to the first node Q(3) and the third node Qin(3) through the second transistor T2 and the twenty-first transistor T21, and potentials of the first node Q(3) and the third node Qin(3) are raised. Since the potentials of the first node Q(3) and the third node Qin(3) are raised, the fifth transistor T5 and the twenty-third transistor T23 are turned on, the constant-voltage low-level signal VGL is outputted to the second node P(3) through the fifth transistor T5 and the twenty-third transistor T23, therefore the eleventh transistor T11 and the twelfth transistor T12 are turned off. Meanwhile, since the gate of the sixth transistor T6 receives the constant-voltage high-level signal VGH, the sixth transistor T6 is turned on, and the first node Q(3) is transmitted to the gate of the seventh transistor T7. Since the potential of the first node Q(3) is raised, the seventh transistor T7 is turned on, the third clock signal CK3 is at the low-level, the third clock signal CK3 is outputted through the seventh transistor T7, therefore the scan driving signal of the current stage G(3) is at the low-level.

In a second time period t2, due to effects of the first capacitor C1 and the second capacitor C2, the potential of the first node Q(3) is still at the high-level, and the potential of the second node P(3) is still at the low-level. At this time, the third clock signal CK3 is at the low-level, and the third clock signal CK3 is outputted through the seventh transistor T7, therefore the scan driving signal of the current stage G(3) is at the low-level.

During a third time period t3, the third clock signal CK3 is at the high-level. Due to effects of the first capacitor C1 and the second capacitor C2, the potential of the first node Q(3) is still at the high-level at this time, and the potential of the second node P(3) is still at the low-level. Due to the high-level of the first node Q(3), the seventh transistor T7 is turned on, the third clock signal CK3 is at the high-level, and the third clock signal CK3 is outputted through the seventh transistor T7, therefore the scan driving signal of the current stage G(3) is at the high-level.

In a fourth time period t4, the fourth clock signal CK4 is at the high-level, therefore the eighth transistor T8 is turned on, the constant-voltage high-level signal VGH is outputted to the second node P(3) through the tenth transistor T10, the eleventh transistor T11 and the twelfth transistor T12 are turned on, the constant-voltage low-level signal VGL is outputted to the first node Q(3) through the eleventh transistor T11, and the constant-voltage low-level signal VGL is outputted to the scan driving signal of the current stage G(3) through the twelfth transistor T12. At this time, the potential of the first node Q(3) and the potential of the scan driving signal of the current stage G(3) are pulled down to the potential of the constant-voltage low-level signal VGL.

Similarly, when the GOA device 100 performs a reverse scan, the forward scan signal U2D is at the low-level and the reverse scan signal D2U is at the high-level.

In the fourth time period t4, the fourth clock signal CK4 is at the high-level, and the scan driving signal of the next stage G(n+2) is at the high-level. At this time, the fourth transistor T4 is turned on, the twenty-second transistor T22 is turned on, the reverse scan signal D2U is outputted to the first node Q(3) through the fourth transistor T4 and the twenty-second transistor T22, and the potential of the first node Q(3) is raised. Since the potential of the first node Q(3) is raised, the fifth transistor T5 is turned on, the constant-voltage low-level signal VGL is outputted to the second node P(3), therefore the eleventh transistor T11 and the twelfth transistor T12 are turned off. Meanwhile, since the potential of the first node Q(3) is raised, the seventh transistor T7 is turned on, the third clock signal CK3 is at the low-level, and the third clock signal CK3 is outputted through the seventh transistor T7, therefore the scan driving signal of the current stage G(3) is at the low-level.

During the third time period t3, the third clock signal CK3 is at the high-level. Due to effects of the first capacitor C1 and the second capacitor C2, the potential of the first node Q(3) is still at the high-level at this time, and the potential of the second node P(3) is still at the low-level. Due to the potential of the first node Q(3) is at the high-level, the seventh transistor T7 is turned on, the third clock signal CK3 is at the high-level, and the third clock signal CK3 is outputted through the seventh transistor T7, therefore the scan driving signal of the current stage G(3) is at the high-level.

In the second time period t2, the second clock signal CK2 is at the high-level, the tenth transistor T10 is turned on, the constant-voltage high-level signal VGH is outputted to the second node P(3) through the tenth transistor T10, the eleventh transistor T11 and the twelfth transistor T12 are turned on, the constant-voltage low-level signal VGL is outputted to the first node Q(3) through the eleventh transistor T11, and the constant-voltage low-level signal VGL is outputted to the scan driving signal of the current stage G(3) through the twelfth transistor T12. At this time, the potential of the first node Q(3) and the potential of the scan driving signal of the current stage G(3) are pulled down to the potential of the constant-voltage low-level signal VGL.

In the first time period t1, the first clock signal CK1 is at the high-level, the scan driving signal of the previous stage G1 is at the high-level, and the low-level signal of the forward scan signal U2D is transmitted to the first node Q(3), therefore the first node Q(3) maintains the corresponding low-level.

In the present embodiment, the GOA device 100 by adding the twenty-second transistor T22 and the twenty-third transistor T23 in the forward-reverse scan module 101, and controlling the potential of the second node P(n) through the first node Q(n) and the third node Qin(n), reducing influence of the U2D/D2U/Gate signals on the first node Q(n), thereby improving stability of the circuit structure, and further improving reliability of the GOA device 100.

Referring to FIG. 2, the function control module 104 can be connected to the first function control signal Gas1 and the second function control signal Gas2, and is electrically connected to the first node Q(n), the second node P(n), and the scan driving signal of the current stage G(n), configured to realize the turn on function and the turn off function of the GOA device 100 on all scan driving signals.

In the present embodiment, the GOA device 100 includes a turn on function phase and a turn off function phase. In the turn on function phase, the first function control signal Gas1 is at the high-level, and the second function control signal Gas2 is at the low-level; in the turn off function phase, the first function control signal Gas1 is at the low-level, and the second function control signal Gas2 is at the high-level.

When the GOA device 100 is in the turn on function phase, the forward scan signal U2D and/or the reverse scan signal D2U can isolate a path from the first node Q(n) by the scan driving signal of the previous stage G(n−2) and the scan driving signal of the next stage G(n+2). The forward scan signal U2D and/or the reverse scan signal D2U with the high-level used to commence driving, to prevent a pathway conflict within the GOA device 100. In addition, in the present embodiment, the first function control signal Gas1 can be configured to control the pull-down of the potentials of the first node Q(n) and the third node Qin(n), which can improve the stability of the GOA device 100 in a reset operation and reduces risk of an appearance of afterimages in a product.

Figure 4:
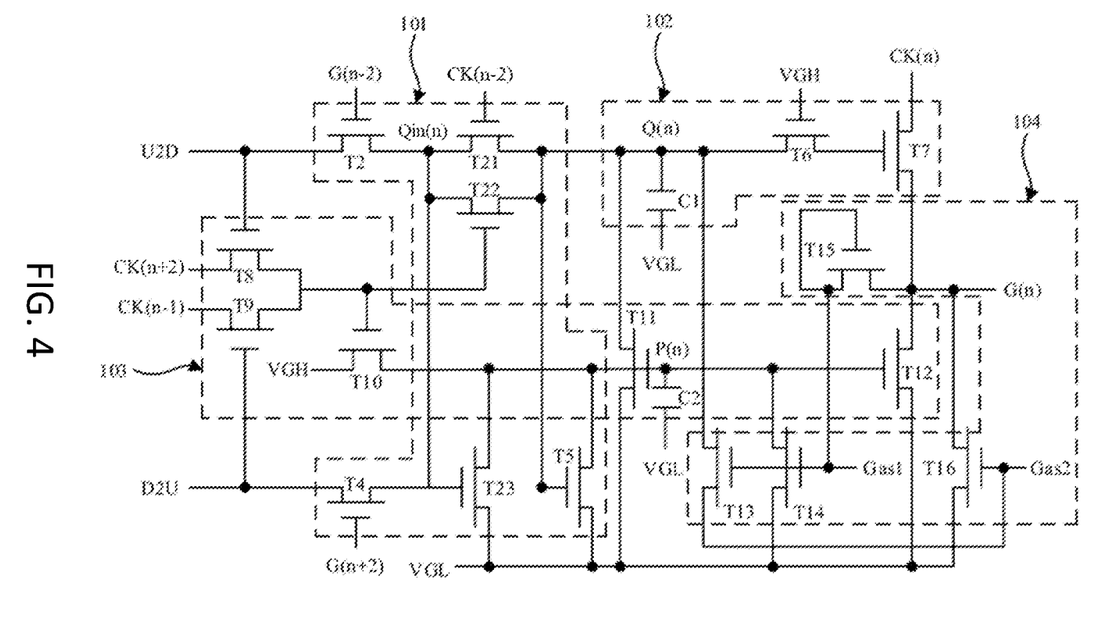
FIG. 4 is a schematic diagram of a second circuit of the GOA unit of the GOA device of the present application.

Please refer to FIG. 4. A circuit structural diagram shown in FIG. 4 is same as or similar to FIG. 2 except that the function control module 104 can further include the thirteenth transistor T13, the fourteenth transistor T14, the fifteenth transistor T15, and the sixteenth transistor T16.

Wherein, a gate of the thirteenth transistor T13, a gate of the fourteenth transistor T14, and a source and a gate of the fifteenth transistor T15 receive the first function control signal Gas1. A source of the thirteenth transistor T13 and a gate of the sixteenth transistor T16 receive the second function control signal Gas2. A source of the fourteenth transistor T14 and a source of the sixteenth transistor T16 receive the constant-voltage low-level signal VGL. A drain of the thirteenth transistor T13 is electrically connected to the first node Q(n), a drain of the fourteenth transistor T14 is electrically connected to the second node P(n), a drain of the fifteenth transistor T15 and a drain of the sixteenth transistor T16 are electrically connected to the scan driving signal of the current stage G(n).

In the present embodiment, the GOA device 100 also includes a turn on function phase and a turn off function phase. In the turn on function phase, the first function control signal Gas1 is at the high-level, and the second function control signal Gas2 is at the low-level; in the turn off function phase, the first function control signal Gas1 is at the low-level, and the second function control signal Gas2 is at the high-level.

When the product is in a scanning period, the GOA device 100 is in the turn off function phase. At this time, the first function control signal Gas1 is at the low-level and the second function control signal Gas2 is at the high-level, and the second function control signal Gas2 connected to the source of the thirteenth transistor T13 is at the high-level. Therefore, when the first node Q(n) is at the high-level, the leakage of the thirteenth transistor T13 can be effectively reduced, and the stability of the product in the scanning period is improved.

The present application further proposes a display panel including the above-mentioned GOA device and a functional display layer on the GOA device. Function of the display panel is same as or similar to that of the GOA device described above, and will not be repeated here.

The present application proposes a GOA device and a display panel. In the present application, by adding the twenty-first transistor and the first control clock terminal electrically connected to the twenty-first transistor in the forward-reverse scan module to control the potentials of the first node and the third node, the leakage of the first node during operation can be reduced, thereby improving reliability of the GOA device.

It can be understood that, for those of ordinary skill in the art, equivalent replacements or changes can be made according to the technical solutions and inventive concepts of the present application, and all such changes or replacements should fall within the protection scope of the claims appended to the present application.

What is claimed is:

1. A gate driver on array (GOA) device, comprising multiple cascaded GOA units, with any stage of the GOA units comprising a forward-reverse scan module, an output module, a pull-down module, and a function control module;

wherein the forward-reverse scan module receives a scan driving signal of a previous stage, a forward scan signal, a scan driving signal of a next stage, a reverse scan signal, and a constant-voltage low-level signal, and is electrically connected to a first control clock terminal, a first node, and a second node, configured to output the forward scan signal to the first node, or configured to output the reverse scan signal to the first node, and output the constant-voltage low-level signal to the second node under control of a potential of the first node;

wherein the output module receives the constant-voltage low-level signal and a constant-voltage high-level signal, and is electrically connected to the first node and a third control clock terminal, configured to output a scan driving signal of a current stage;

wherein the pull-down module receives the constant-voltage low-level signal, the forward scan signal, the reverse scan signal, and the constant-voltage high-level signal, and is electrically connected to a second control clock terminal, a fourth control clock terminal, the first node, and the scan driving signal of the current stage, configured to pull down the potential of the first node and a potential of the scan driving signal of the current stage to a potential of the constant-voltage low-level signal;

wherein the function control module receives a first function control signal and a second function control signal, and is electrically connected to the first node, the second node, and the scan driving signal of the current stage, configured to realize a turn on function and a turn off function of the GOA device on all scan driving signals; and wherein the forward scan signal and the reverse scan signal are both direct current (DC) power sources, and a potential of the forward scan signal is opposite to a potential of the reverse scan signal;

wherein the forward-reverse scan module comprises a second transistor, a twenty-first transistor, a twenty-second transistor, a twenty-third transistor, a fourth transistor, and a fifth transistor;

wherein a gate of the second transistor receives the scan driving signal of the previous stage, a source of the second transistor receives the forward scan signal, and a drain of the second transistor is electrically connected to the third node;

wherein a source of the twenty-first transistor and a source of the twenty-second transistor are electrically connected to the third node, a drain of the twenty-first transistor and a drain of the twenty-second transistor are electrically connected to the first node, a gate of the twenty-first transistor is electrically connected to the first control clock terminal, and a gate of the twenty-second transistor is electrically connected to a gate of a tenth transistor;

wherein a gate of the fourth transistor receives the scan driving signal of the next stage, a source of the fourth transistor receives the reverse scan signal, and a drain of the fourth transistor is electrically connected to the third node and a gate of the twenty-third transistor;

wherein a source of the twenty-third transistor receives the constant-voltage low-level signal, and a drain of the twenty-third transistor is electrically connected to the second node and a drain of the tenth transistor;

wherein a gate of the fifth transistor is electrically connected to the first node, a source of the fifth transistor receives the constant-voltage low-level signal, and a drain of the fifth transistor is electrically connected to the second node and the drain of the tenth transistor;

wherein the drain of the twenty-second transistor is electrically connected to the gate of the fifth transistor;

wherein the function control module receives a first function control signal and a second function control signal and is configured to realize a turn on function and a turn off function of the GOA device on all scan driving signals, wherein the function control module comprises a thirteenth transistor, a fourteenth transistor, a fifteenth transistor, and a sixteenth transistor, and wherein a gate of the thirteenth transistor, a gate of the fourteenth transistor, and a source and a gate of the fifteenth transistor receive the first function control signal, a source of the thirteenth transistor and a gate of the sixteenth transistor receive the second function control signal, a source of the fourteenth transistor and a source of the sixteenth transistor receive the constant-voltage low-level signal, a drain of the thirteenth transistor is electrically connected to the first node, a drain of the fourteenth transistor is electrically connected to the second node, a drain of the fifteenth transistor and a drain of the sixteenth transistor are electrically connected to the scan driving signal of the current stage; and wherein the gate driver on array device further comprises a turn on function phase and a turn off function phase, wherein in the turn on function phase, the first function control signal is high level and the second function control signal is low level, and wherein in the turn off function phase, the first function control signal is low level and the second function control signal is high level.

2. The GOA device according to claim 1, wherein the output module comprises a sixth transistor, a seventh transistor, and a first capacitor;

wherein a gate of the sixth transistor receives the constant-voltage high-level signal, a source of the sixth transistor is electrically connected to the first node, and a drain of the sixth transistor is electrically connected to a gate of the seventh transistor;

wherein a source of the seventh transistor is electrically connected to the third control clock terminal, and a drain of the seventh transistor is electrically connected to the scan driving signal of the current stage; and wherein an end of the first capacitor is electrically connected to the first node, and another end of the first capacitor is electrically connected to the constant-voltage low-level signal.

3. The GOA device according to claim 1, wherein the pull-down module comprises an eighth transistor, a ninth transistor, a tenth transistor, an eleventh transistor, a twelfth transistor, and a second capacitor, wherein a gate of the eighth transistor receives the forward scan signal, a source of the eighth transistor is electrically connected to the fourth control clock terminal, a gate of the ninth transistor receives the reverse scan signal, a source of the ninth transistor is electrically connected to the second control clock terminal, a drain of the eighth transistor and a drain of the ninth transistor are electrically connected to a gate of the tenth transistor, a source of the tenth transistor receives the constant-voltage high-level signal, a drain of the tenth transistor, a gate of the eleventh transistor, and a gate of the twelfth transistor are electrically connected to the second node, a source of the eleventh transistor and a source of the twelfth transistor receive the constant-voltage low-level signal, a drain of the eleventh transistor is electrically connected to the first node, a drain of the twelfth transistor is electrically connected to the scan driving signal of the current stage, an end of the second capacitor is electrically connected to the second node, and another end of the second capacitor is electrically connected to the constant-voltage low-level signal.

4. The GOA device according to claim 1, wherein the GOA device receives a first clock signal, a second clock signal, a third clock signal, and a fourth clock signal, and the first clock signal, the second clock signal, the third clock signal, and the fourth clock signal are respectively valid within one operating period in turn.

5. The GOA device according to claim 4, wherein in a (1+4k)th staged GOA unit, the first control clock terminal receives the third clock signal, the second control clock terminal receives the fourth clock signal, the third control clock terminal receives the first clock signal, and the fourth control clock terminal receives the second clock signal;

In a (2+4k)th staged GOA unit, the first control clock terminal receives the fourth clock signal, the second control clock terminal receives the first clock signal, the third control clock terminal is connected to the second clock signal, and the fourth control clock terminal receives the third clock signal;

in a (3+4k)th staged GOA unit, the first control clock terminal receives the first clock signal, the second control clock terminal receives the second clock signal, the third control clock terminal receives the third clock signal, and the fourth control clock terminal receives the fourth clock signal;

in a (4+4k)th staged GOA unit, the first control clock terminal receives the second clock signal, the second control clock terminal receives the third clock signal, the third control clock terminal receives the fourth clock signal, and the fourth control clock terminal receives the first clock signal; and wherein k is a positive integer.

6. A display panel, comprising a gate driver on array (GOA) device and a functional display layer disposed on the GOA device, wherein the GOA device comprises multiple cascaded GOA units, with any stage of the GOA units comprising a forward-reverse scan module, an output module, a pull-down module, and a function control module;

wherein the forward-reverse scan module receives a scan driving signal of a previous stage, a forward scan signal, a scan driving signal of a next stage, a reverse scan signal, and a constant-voltage low-level signal, and is electrically connected to a first control clock terminal, a first node, and a second node, configured to output the forward scan signal to the first node, or configured to output the reverse scan signal to the first node, and outputs the constant-voltage low-level signal to the second node under control of a potential of the first node;

wherein the output module receives the constant-voltage low-level signal and a constant-voltage high-level signal, and is electrically connected to the first node and a third control clock terminal, configured to output a scan driving signal of a current stage;

wherein the pull-down module receives the constant-voltage low-level signal, the forward scan signal, the reverse scan signal, and the constant-voltage high-level signal, and is electrically connected to a second control clock terminal, a fourth control clock terminal, the first node, and the scan driving signal of the current stage, configured to pull down the potential of the first node and a potential of the scan driving signal of the current stage to a potential of the constant-voltage low-level signal;

wherein the forward scan signal and the reverse scan signal are both direct current (DC) power sources, and a potential of the forward scan signal is opposite to a potential of the reverse scan signal;

wherein the forward-reverse scan module comprises a second transistor, a twenty-first transistor, a twenty-second transistor, a twenty-third transistor, a fourth transistor, and a fifth transistor;

wherein a gate of the second transistor receives the scan driving signal of the previous stage, a source of the second transistor receives the forward scan signal, and a drain of the second transistor is electrically connected to the third node;

wherein a source of the twenty-first transistor and a source of the twenty-second transistor are electrically connected to the third node, a drain of the twenty-first transistor and a drain of the twenty-second transistor are electrically connected to the first node, a gate of the twenty-first transistor is electrically connected to the first control clock terminal, and a gate of the twenty-second transistor is electrically connected to a gate of a tenth transistor;

wherein a gate of the fourth transistor receives the scan driving signal of the next stage, a source of the fourth transistor receives the reverse scan signal, and a drain of the fourth transistor is electrically connected to the third node and a gate of the twenty-third transistor;

wherein a source of the twenty-third transistor receives the constant-voltage low-level signal, and a drain of the twenty-third transistor is electrically connected to the second node and a drain of the tenth transistor; and wherein a gate of the fifth transistor is electrically connected to the first node, a source of the fifth transistor receives the constant-voltage low-level signal, and a drain of the fifth transistor is electrically connected to the second node and the drain of the tenth transistor;

wherein the drain of the twenty-second transistor is electrically connected to the gate of the fifth transistor;

wherein the function control module receives a first function control signal and a second function control signal and is configured to realize a turn on function and a turn off function of the GOA device on all scan driving signals, wherein the function control module comprises a thirteenth transistor, a fourteenth transistor, a fifteenth transistor, and a sixteenth transistor, and wherein a gate of the thirteenth transistor, a gate of the fourteenth transistor, and a source and a gate of the fifteenth transistor receive the first function control signal, a source of the thirteenth transistor and a gate of the sixteenth transistor receive the second function control signal, a source of the fourteenth transistor and a source of the sixteenth transistor receive the constant-voltage low-level signal, a drain of the thirteenth transistor is electrically connected to the first node, a drain of the fourteenth transistor is electrically connected to the second node, a drain of the fifteenth transistor and a drain of the sixteenth transistor are electrically connected to the scan driving signal of the current stage; and wherein the gate driver on array device further comprises a turn on function phase and a turn off function phase, wherein in the turn on function phase, the first function control signal is high level and the second function control signal is low level, and wherein in the turn off function phase, the first function control signal is low level and the second function control signal is high level.

7. The display panel according to claim 6, wherein the output module comprises a sixth transistor, a seventh transistor, and a first capacitor;

wherein a gate of the sixth transistor receives the constant-voltage high-level signal, a source of the sixth transistor is electrically connected to the first node, and a drain of the sixth transistor is electrically connected to a gate of the seventh transistor;

wherein a source of the seventh transistor is electrically connected to the third control clock terminal, and a drain of the seventh transistor is electrically connected to the scan driving signal of the current stage; and wherein an end of the first capacitor is electrically connected to the first node, and another end of the first capacitor is electrically connected to the constant-voltage low-level signal.

8. The display panel according to claim 6, wherein the pull-down module comprises an eighth transistor, a ninth transistor, a tenth transistor, an eleventh transistor, a twelfth transistor, and a second capacitor, wherein a gate of the eighth transistor receives the forward scan signal, a source of the eighth transistor is electrically connected to the fourth control clock terminal, a gate of the ninth transistor receives the reverse scan signal, a source of the ninth transistor is electrically connected to the second control clock terminal, a drain of the eighth transistor and a drain of the ninth transistor are electrically connected to a gate of the tenth transistor, a source of the tenth transistor receives the constant-voltage high-level signal, a drain of the tenth transistor, a gate of the eleventh transistor, and a gate of the twelfth transistor are electrically connected to the second node, a source of the eleventh transistor and a source of the twelfth transistor receive the constant-voltage low-level signal, a drain of the eleventh transistor is electrically connected to the first node, a drain of the twelfth transistor is electrically connected to the scan driving signal of the current stage, an end of the second capacitor is electrically connected to the second node, and another end of the second capacitor is electrically connected to the constant-voltage low-level signal.

9. The display panel according to claim 6, wherein the GOA device receives a first clock signal, a second clock signal, a third clock signal, and a fourth clock signal, and the first clock signal, the second clock signal, the third clock signal, and the fourth clock signal are respectively valid within one operating period in turn.

10. The display panel according to claim 9, wherein in a (1+4k)th staged GOA unit, the first control clock terminal receives the third clock signal, the second control clock terminal receives the fourth clock signal, the third control clock terminal receives the first clock signal, and the fourth control clock terminal receives the second clock signal;

in a (2+4k)th staged GOA unit, the first control clock terminal receives the fourth clock signal, the second control clock terminal receives the first clock signal, the third control clock terminal is connected to the second clock signal, and the fourth control clock terminal receives the third clock signal;

in a (3+4k)th staged GOA unit, the first control clock terminal receives the first clock signal, the second control clock terminal receives the second clock signal, the third control clock terminal receives the third clock signal, and the fourth control clock terminal receives the fourth clock signal;

in a (4+4k)th staged GOA unit, the first control clock terminal receives the second clock signal, the second control clock terminal receives the third clock signal, the third control clock terminal receives the fourth clock signal, and the fourth control clock terminal receives the first clock signal; and wherein k is a positive integer.

* * * * *